United States Patent
Raebiger et al.

(10) Patent No.: US 7,006,195 B2
(45) Date of Patent: Feb. 28, 2006

(54) METHOD AND SYSTEM FOR IMPROVING EXPOSURE UNIFORMITY IN A STEP AND REPEAT PROCESS

(75) Inventors: Jan Raebiger, Dresden (DE); Heiko Wagner, Dresden (DE); Uwe Schulze, Dresden (DE); Rolf Seltmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 63 days.

(21) Appl. No.: 10/625,451

(22) Filed: Jul. 23, 2003

(65) Prior Publication Data

US 2004/0165164 A1    Aug. 26, 2004

(30) Foreign Application Priority Data

Feb. 26, 2003   (DE) ................................ 103 08 271

(51) Int. Cl.
G03B 27/42   (2006.01)
G03B 27/32   (2006.01)
G01N 21/00   (2006.01)
G03C 5/00    (2006.01)

(52) U.S. Cl. ..................... 355/53; 355/77; 356/237.5; 430/30

(58) Field of Classification Search ................. 355/53, 355/67, 77; 430/30, 312; 356/237.5
See application file for complete search history.

(56) References Cited

U.S. PATENT DOCUMENTS

| | | | |
|---|---|---|---|
| 6,259,521 B1 * | 7/2001 | Miller et al. | 356/237.5 |
| 6,482,573 B1 | 11/2002 | Bhakta et al. | 430/313 |
| 2002/0001070 A1 | 1/2002 | Park | 355/35 |
| 2002/0012861 A1 | 1/2002 | Luhn et al. | 430/30 |
| 2002/0106821 A1 | 8/2002 | Bode et al. | 438/16 |

* cited by examiner

*Primary Examiner*—Alan Mathews
(74) *Attorney, Agent, or Firm*—Williams, Morgan & Amerson, P.C.

(57) ABSTRACT

An advanced control system for a photolithography tool that receives measurement data relating to inline parameters varying with position on a substrate surface. The position sensitive measurement data is used to establish a position dependent target offset for an exposure map, thereby effectively compensating for substrate non-uniformities. Since the inline measurement data is available significantly earlier in comparison to electrical measurement data of a completed circuit element, a more accurate exposure map may be obtained taking into account the process history of the substrates.

2 Claims, 2 Drawing Sheets

METHOD AND SYSTEM FOR IMPROVING EXPOSURE UNIFORMITY IN A STEP AND REPEAT PROCESS

BACKGROUND OF THE INVENTION

1. Field of the Invention

The present invention relates to the field of fabrication of integrated circuits, and, more particularly, to the compensation for device feature non-uniformities across the wafer area by adapting exposure conditions of a step and scan photolithography tool.

2. Description of the Related Art

Fabrication of integrated circuits requires the precise formation of very small features with a very small tolerance for error. Such features may be formed in a material layer formed above an appropriate substrate, such as a silicon substrate. These features of precisely controlled size are generated by patterning the material layer by performing known photo-lithography and etching processes, wherein a masking layer is formed over the material layer to be etched to define these features. Generally, a masking layer may consist of or is formed by means of a layer of photoresist that is patterned by a lithographic process. During the lithographic process, the resist may be spin-coated onto the wafer surface and is then selectively exposed to ultraviolet radiation. After developing the photoresist, depending on the type of resist, positive resist or negative resist, the exposed portions or the non-exposed portions are removed to form the required pattern in the layer of photoresist. Since the dimensions of the patterns in sophisticated integrated circuits are steadily decreasing, the equipment used for patterning device features have to meet very stringent requirements with regard to resolution and overlay accuracy of the involved fabrication processes. In this respect, resolution is considered as a measure specifying the consistent ability to print images of a minimum size under conditions of pre-defined manufacturing variations. One important factor in improving the resolution is represented by the lithographic process, in which patterns contained in a photo mask or reticle are optically transferred to the layer of photo-resist via an optical imaging system. Therefore, great efforts are made to steadily improve optical properties of the lithographic system, such as numerical aperture, depth of focus and wavelength of the light source used. The quality of the lithographic imagery is extremely important in creating very small feature sizes.

Of at least comparable importance, however, is the accuracy with which an image can be positioned on the surface of the substrate. Integrated circuits are typically fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure and development. Furthermore, non-uniformities of the etching processes can also lead to variations of the etched features. In addition, there exists an uncertainty in overlaying the image of the pattern for the current material layer to the pattern of the previously formed material layer while photolithographically transferring the image onto the substrate.

A further aspect affecting the quality of device features and hence the electrical behavior thereof is the employment of substrates, i.e., wafers, having an increased diameter, wherein a typical wafer diameter is 200 mm with the prospect of 300 mm to become the standard wafer diameter in modern semiconductor facilities. Large diameters, although desirable in view of economical considerations, may, however, exacerbate the problem of non-uniformities across the wafer surface, especially as the minimum device dimensions, also referred to as critical dimensions (CD), steadily decrease. It is therefore desirable to minimize feature variations not only from wafer to wafer but also across the entire wafer surface to allow semiconductor manufacturers to use processes in which the tolerances may be set more tightly so as to achieve improved production yield while at the same time enhance device performance in view of, for example, operational speed. Otherwise, the fluctuations across the wafer (and the wafer-to-wafer variations) may be taken into account, thereby requiring a circuit design that tolerates higher process discrepancies.

One appropriate way to reduce wafer non-uniformities is offered by the presently applied lithography technique in which a plurality of individual dies or exposure fields are exposed in a step and scan process. That is, each exposure event includes its specific alignment procedure along with a specified tool setting. Thus, the lithography process may be used to compensate for at least some of the wafer non-uniformities generated during the processing of the wafer. To this end, conventionally one or more electrical characteristics are measured and are related to one or more lithography tool specific parameters to readjust the tool setting for each position of the exposure field on the basis of these measurement results. A conventional approach for such a tool control is based on the distribution of one or more electrical parameters across the wafer surface to derive a so-called position dependent exposure map, denoted as $E(x,y)$ with x,y being position coordinates on the wafer, by, for example, a linear procedure. The exposure map $E(x,y)$ may include one or more tool parameters or any other parameters required for adjusting the tool characteristics at the position x,y. A linear approach may be appropriate when it is assumed that the relationship between the exposure map and the electrical characteristics needs to be sufficiently correct within a relatively small range of the electrical characteristic only. Thus, the linear relationship may be expressed as follows:

$$E(x,y)=\gamma CD_{target}(x,y)+b, \quad (1)$$

wherein $CD_{target}(x,y)$ represents a setpoint for the critical dimension at the position x,y and $\gamma$ represents a constant relating the critical dimension of a feature, for example the gate length of a transistor, to the corresponding tool characteristic, such as depth of focus, alignment specific parameters, and the like. The constant b indicates a parameter for adjusting the offset of exposure map E in the above linear relationship (1). The position dependent critical dimension $CD_{target}(x,y)$ may, in turn, be composed of a position independent term $CD_{target}$, indicating the desired design CD for the feature under consideration, and a position dependent deviation or offset $CD_{offset}(x,y)$. Thus, $CD_{target}(x,y)$ may be written as:

$$CD_{target}(x,y)=CD_{target}+CD_{offset}(x,y) \quad (2)$$

The position dependent offset $CD_{offset}(x,y)$ may be obtained by a correlation between the offset $CD_{offset}(x,y)$ and measurement data of one or more electrical parameters, indicated hereinafter as $P^{el}$, wherein the electrical parameter $P^{el}$ may be considered as one or more parameters that are well accessible by measurement and also reasonably assignable to the critical dimension. For instance, the rise and fall times of transistor elements may be determined by measurement after completion of the transistor elements and may be used to establish a suitable correlation between the measurement data and the offset $CD_{offset}(x,y)$. The position dependent offset $CD_{offset}(x,y)$ may then be expressed by:

$$CD_{offset}(x,y)=\alpha(P^{el}(x,y)-P^{el}_{target}) \quad (3)$$

wherein $P^{el}_{target}$ represents a design value of the electrical parameter under interest and $\alpha$ represents a constant describing the degree of influence of the difference of the measurement data $P^{el}(x,y)$ and the target value $P^{el}_{target}$ on the position dependent offset $CD_{offset}(x,y)$.

To obtain a sufficiently "strong" correlation between the electrical parameter $P^{el}(x,y)$ and the position dependent offset $CD_{offset}(x,y)$, a large amount of measurement data is usually necessary that may be averaged over a large number of substrates. Although the above discussed approach allows a moderate improvement in reducing wafer specific non-uniformities, the overall effect on the process control is limited owing to the required averaging of a large number of substrates that may even be processed in different "threads" of process tools, depending on process utilization and facility internal requirements. As a consequence, the above process control strategy only addresses fluctuations concerning all of the substrates irrespective of the process "history" of individual groups of substrates, since the correlation described by equation (3) is a feedback loop only, wherein effects not common to all substrates are "blurred," especially as the delay between the lithography process and the receipt of the measurement data $P^{el}(x,y)$ is significant. Moreover, the blurring of process history specific fluctuations leads to a control effect for compensating for a "quasi-static" distribution of the wafer non-uniformities, wherein such a quasi-static distribution in many cases may be an over-simplified assumption due to the different process threads of different groups of substrates, thereby unduly restricting the control quality and thus the device characteristics.

In view of the above-identified problems, it is therefore desirable to develop a control strategy for a lithography process, wherein one or more of the above constraints may be avoided or at least reduced.

SUMMARY OF THE INVENTION

Generally, the present invention is directed to a technique for obtaining an exposure map and for exposing a substrate on the basis of position sensitive data or information obtained "inline" or dynamically, for example, by measurement processes carried out in processing the substrate or by measurement processes that may be carried out in addition to usually performed measurement procedures without undue delay for further processes. The inline data or information may be gathered prior to or after the lithography process, wherein the data and information are not restricted to electrically measured parameters.

According to one illustrative embodiment of the present invention, a method of determining at least one exposure parameter for a multi-step exposure process in a semiconductor line is provided. The method comprises obtaining information about an inline parameter indicative of a characteristic of a predefined location on a substrate and updating at least one exposure parameter for the predefined location on the basis of the information.

According to another illustrative embodiment, a method of forming a circuit feature on a plurality of substantially identical substrates in a semiconductor production line comprises preparing the substrates for receiving a resist mask corresponding to the circuit feature. An exposure map is established for a step and repeat exposure of the substrates. The exposure map is updated for a plurality of specified locations on a specified one of the substrates on the basis of inline measurement data obtained from one or more of the substrates. The specified substrate is exposed with the updated exposure map to form the resist mask, and a manufacturing sequence is performed to form the circuit feature by using the resist mask.

According to yet another illustrative embodiment of the present invention, a method of controlling a multi-step exposure of substrates during the formation of a circuit feature comprises obtaining pre-exposure measurement data related to a predefined location on a substrate to be exposed. At least one exposure parameter is then adjusted for the predefined location on the basis of the pre-exposure measurement data. Finally, a substrate is exposed at the predefined location with the adjusted exposure parameter.

According to a further illustrative embodiment of the present invention, a method of controlling a multi-step exposure of substrates during the formation of a circuit feature comprises obtaining post-exposure measurement data related to a predefined location on a substrate to be exposed. At least one exposure parameter is adjusted for the predefined location on the basis of the post-exposure measurement data. Moreover, a substrate is exposed at the predefined location with the adjusted exposure parameter.

According to still a further illustrative embodiment of the present invention, an advanced exposure tool control system comprises a control unit operatively connectable to an exposure tool and configured to adjust at least one exposure parameter of the exposure tool. The control unit is further configured to receive information about an inline parameter indicative of a characteristic of a predefined location on a substrate. The control unit is further adapted to update the exposure parameter for the predefined location on the basis of the information.

BRIEF DESCRIPTION OF THE DRAWINGS

The invention may be understood by reference to the following description taken in conjunction with the accompanying drawings, in which like reference numerals identify like elements, and in which.

Figure 1A:
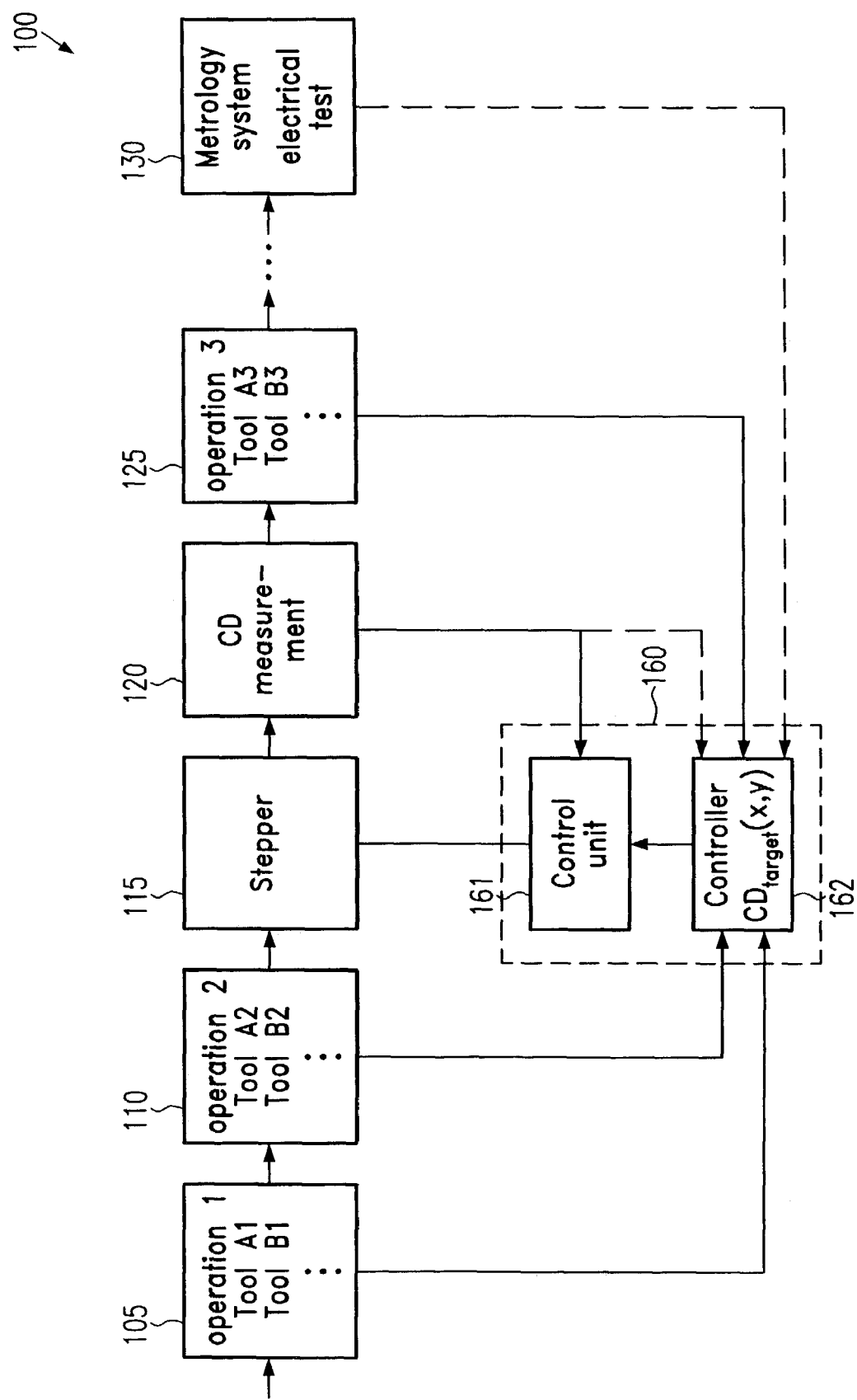
FIG. 1a schematically shows a portion of a semiconductor process line including a plurality of process tools upstream of a step and repeat lithography tool and a plurality of process tools downstream of the lithography tool that receives inline measurement data according to one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
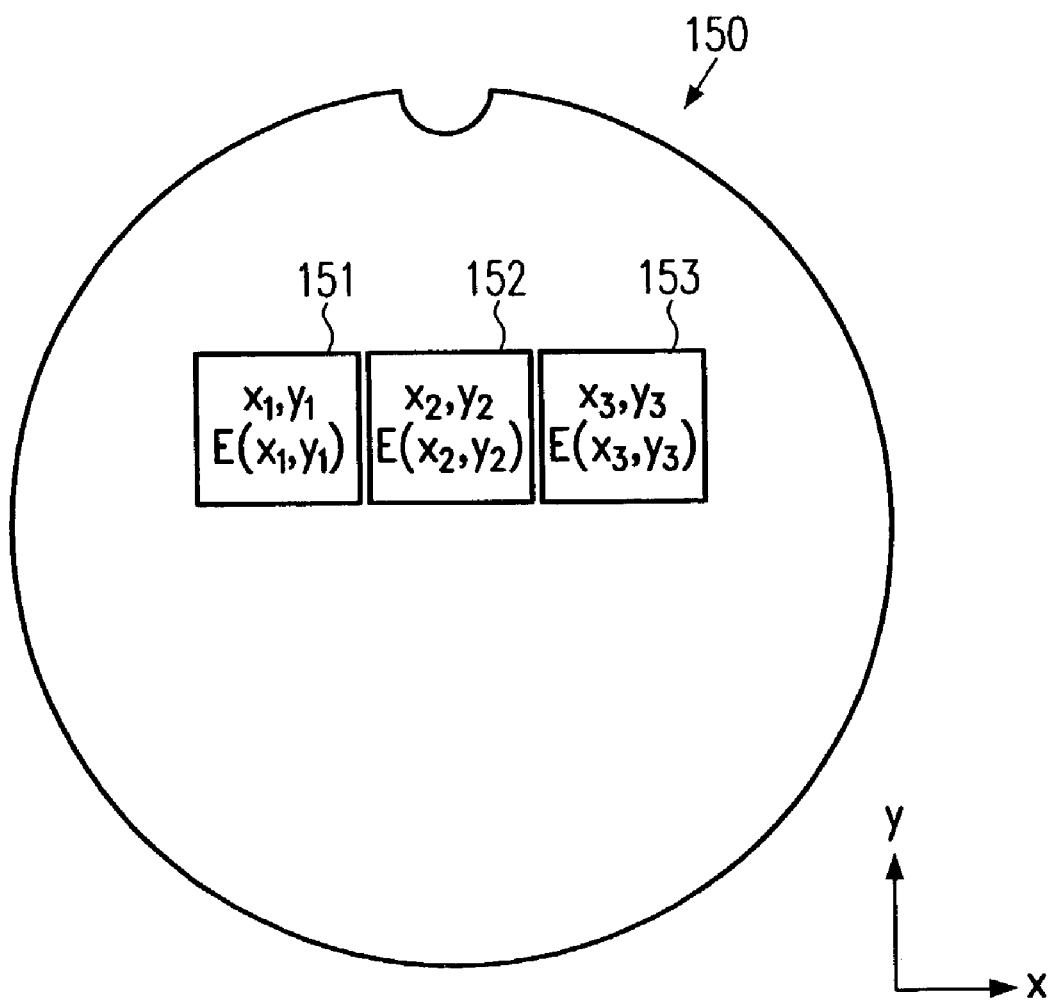
FIG. 1b schematically shows a substrate having formed thereon a plurality of exposure fields created by a dynamically updated exposure map according to one illustrative embodiment of the present invention.

With reference to FIGS. 1a and 1b, further illustrative embodiments of the present invention will now be described. FIG. 1a schematically depicts a semiconductor production line 100, or at least a portion thereof, which will also hereinafter be referred to as production line 100. The production line 100 comprises a plurality of process tools grouped into functional blocks 105, 110, 120, 125, each of which may be configured to perform a specified operation. In the illustrated example, the functional block 105 may include process tools A1, B1, . . . , which may be configured to process substrates according to a prescribed process recipe, wherein the process may be denoted as operation 1. The operation 1 may include one or more process steps including measurement procedures that can be carried out by the process tools A1, B1, . . . of block 105. The tools A1, B1, . . . may themselves be comprised of one or more "sub"-tools or functional units to process a plurality of substrates at the same time, and/or to perform a defined sequence of different process steps that may advantageously be combined. For example, the tools A1, B1, . . . of the block 105 may represent a deposition tool for forming a specified layer of material on a substrate, wherein the tools A1, B1, . . . may include a metrology instrument to obtain information about the thickness variation across the substrate surface. Other representative examples for the block 105 may include tools for chemically mechanically polishing (CMP) a substrate, or coating devices adapted to form a layer of photoresist and/or a layer of anti-reflective coating (ARC) on a substrate. Similarly, the functional blocks 110 and 125 may also include respective process tools adapted to perform respective operations 2 and 3, respectively.

Disposed downstream of the blocks 105 and 110 is a photolithography tool 115, provided as a stepper, which performs a step and repeat or step and scan exposure on a substrate, wherein a plurality of dies or exposure fields are sequentially exposed. Each exposure step may be carried out on the basis of an individually adjusted set of exposure parameters that are commonly referred to as exposure map. The exposure map may include one or more tool specific parameters determining the characteristics of each individual exposure step. Examples of tool specific parameters may be alignment parameters, depth of focus, exposure time, and the like.

FIG. 1b schematically shows a substrate 150 that is processed by the photolithography tool 115. The substrate includes exposure fields 151, 152, 153 located at positions $\{x_1, y_1\}$, $\{x_2, y_2\}$ and $\{x_3, y_3\}$, respectively, wherein the coordinates $x_i$, $y_i$ may refer to predefined reference points of the substrate 150 and the exposure fields 151, 152, 153. For example, the position $\{x_1, y_1\}$ may refer to the upper left corner of the exposure field 151 with respect to the center of the substrate 150. However, any other choice for a reference system may be appropriate. Each of the exposure fields has been exposed to the radiation of the photolithography tool 115 that is characterized by the exposure map, indicated as E, wherein one or more parameter values of the exposure map may vary with position so that the exposure map E is a function of position and will be written as $E=E(x,y)$. Depending on the abilities and configuration of the photolithography tool 115, the exposure map $E(x,y)$ may even vary within the exposure fields 151, 152, 153. For example, in a step and scan system, one or more parameter values, such as the scanning speed and hence the exposure intensity, may be varied while scanning the respective exposure field. Consequently, the exposure map $E(x,y)$ may represent a step-like function for one or more parameters or may represent a substantially continuous function or a combination thereof For instance, alignment specific parameters may be varied for each exposure field as a whole, whereas the exposure intensity may vary within the exposure fields.

Again referring to FIG. 1a, the photolithography tool 115 is connected to an advanced control system 160 including a control unit 161 and an inline feedback/feedforward controller 162 that is configured to receive "inline" information from the functional blocks 105, 110 arranged, upstream of the photolithography tool 115 and/or receive "inline" information from the block 125 or other process and metrology tools arranged downstream of the photolithography tool 115. The control system 160 may be implemented in a control device of a conventional photolithography tool, or the control system 160 may be implemented in a general purpose computer connected to an appropriate data communications system (not shown). In other embodiments, the control system 160 or parts thereof may be implemented in a facility management system as is usually provided in semiconductor production lines. In the illustrative embodiment depicted in FIG. 1a, the controller 162 is connected to the blocks 105, 110, 125 and to a metrology system 130 that is configured to provide measurement data of one or more electrical parameters. In other embodiments, the controller 162 may be connected to any number of process tools that may provide meaningful information for the exposure process of the photolithography tool 115. For example, the controller may be configured as an inline feedforward controller receiving data and/or information from one or more tools arranged upstream of the photolithography tool 115, such as the blocks 105, 110. In other embodiments, the controller may be configured as a feedback controller only, receiving inline data and information from one or more process tools downstream of the photolithography tool 115, such as the functional block 125.

As previously noted, the measurement data from the metrology system 130 may be obtained at a very advanced manufacturing stage only, since a reliable and meaningful electrical test usually requires that the components to be tested have reached a certain degree of completeness. Therefore, the electrical measurement data may be received with considerable delay with respect to the exposure process performed by the photolithography tool 115, wherein, additionally, a plurality of intermediate processes may have affected the feature under consideration, thereby "averaging" over the plurality of processes and the effect of the photolithography process. Thus, a large number of samples is necessary to obtain significant information relating to the photolithography process. Thus, due to the lack of tool and/or process specific information or data in combination with the significant delay of its provision, the measurement data obtained by the metrology system 130 is herein not considered as "inline" information or data since substantially no information can be gathered that is related to the process history of a substrate or a group of substrates, as opposed to the tool specific data provided to the controller 162 from the functional blocks 105, 110, 125.

The controller 162 is further connected to the control unit 161 to provide a target value $CD_{target}(x,y)$ for the critical dimension (CD) of the feature to be formed by means of the photolithography tool 115. The control unit in turn is connected to a CD measurement tool 120 that is configured to determine the actual CD of a resist feature corresponding to the actual device feature, or the measurement tool 120 may determine the actual CD of the feature under consideration, when it is arranged downstream of a corresponding etch tool (not shown).

During operation of the process line 100, process requirements, that is, tool availability, transport efficiency, and the like, may necessitate a process "thread" for processing a lot of substrates, including, for example, the substrate 150, that may involve the process tools A1, A2 of the blocks 105, 110, respectively, the photolithography tool 115, the metrology tool 120, process tool A3 of block 125 and finally the metrology system 130. However, any other configuration of the process thread may be possible, wherein especially the thread may be changed due to unforeseeable events such as, for example, tool failure and the like. In tool A1, an ARC (anti-reflective coating) may be formed on the substrates, wherein the, composition and especially the thickness of the ARC is an important parameter affecting the following photolithography process in the tool 115. The functional block 105 may therefore include means for determining the layer thickness of the ARC formed by the tool A1. The corresponding measurement data including position dependent information on at least some locations across the substrate surface may then be transferred to the controller 162. For example, the measurement data may contain thickness values regarding a thickness variation between central locations and peripheral locations on the substrate. It should be noted that the measurement data may represent data referring to a single substrate or represent an average over a plurality of substrates. In other embodiments, the tool A1 may provide other tool specific information, which may be helpful in assessing the non-uniformity of the corresponding tool. For instance, previous measurements or data analysis may have revealed a tool specific characteristic of the tool A1, resulting in a typical thickness profile. In other embodiments, for data analysis performed for tool specific information that may be provided by the blocks 105 and/or 110 and that may not include CD relevant measurement data, CD measurement data from the CD measurement tool 120 may be supplied to the controller 162 to establish a CD target value on the basis of the data analysis. In this way, even in a feedforward configuration without measurement data from the blocks 105, 110, an "active" control loop may be established. Consequently, irrespective of whether or not measurement data are contained in the tool specific information and/or data, the corresponding information may be used by the controller 162 to establish a correspondingly adapted exposure map $E(x,y)$. Thus, although the inline information or data delivered by the tool A1 may not necessarily relate to the currently processed substrate(s), it may, however, be sufficiently up-to-date to contribute to the "process history" of the currently processed substrate and may also allow the update of the exposure map in a dynamic fashion.

Similarly, tool A2 may provide a layer of photoresist on the substrates, wherein the layer thickness may vary across the substrate surface. Accordingly, corresponding inline measurement data and/or tool specific information may be provided to the controller 162. Regarding the type of data and/or information, the same criteria apply as pointed out with reference to the tool A1.

Upon receiving the inline data and/or information supplied by the tools A1, A2, the controller 162 determines a position dependent target value for-the critical dimension of the feature under consideration.

A corresponding control scheme according to illustrative embodiments of the present invention will be described next. As pointed out earlier, the exposure map $E(x,y)$ may be expressed, according to one illustrative embodiment, by equation (1):

$$E(x,y)=\gamma CD_{target}(x,y)+b, \tag{1}$$

wherein, contrary to the conventional approach, the position dependent target value $CD_{target}(x,y)$ that is required for advising the control unit 161 in properly operating the photolithography tool 115 may be modified so as to include inline measurement data and/or information. Thus, $CD_{target}(x,y)$ may be written as:

$$CD_{target}(x,y)=CD_{target}+CD_{offset}(x,y)|_{inline}+CD_{offset}(x,y)|_{residual}, \tag{4}$$

wherein $CD_{offset}(x,y)|_{inline}$ represents a position dependent part of the target offset including relevant inline and thus tool specific and history related data and/or information. The term $CD_{offset}(x,y)|_{residual}$ substantially corresponds to the conventional term including the delayed and averaged electrical parameter data. It should be noted that the approach of equation (4) is of illustrative nature only to demonstrate the control scheme for incorporating inline information and data. However, other approaches may be chosen, such as weighting the corresponding position dependent terms by appropriate weighting factors. For instance, as long as the delayed and average electrical parameter data are not available, the target value $CD_{target}(x,y)$ may completely rely on the term $CD_{offset}(x,y)|_{inline}$ and therefore a corresponding weighting factor may be selected to only effect a moderate response to the inline data. In other embodiments, the weighting factor may be "time" dependent by, for example, introducing a moving average based on the amount of data or information gathered so as to tighten the feedforward loop of the controller 162 with an increasing amount of inline data.

In one embodiment, the inline target offset $CD_{offset}(x,y)|_{inline}$ may be expressed as follows:

$$CD_{offset}(x,y)|_{inline} = \Sigma_i \{c_i[P_{inline,i}(x,y) - P_{inline,i}{}^{target}]\}, \quad (5)$$

wherein $P_{inline,i}(x,y)$ represents measurement data and/or tool specific information with respect to a specific inline parameter. For example, $P_{inline,i}(x,y)$ may represent the position dependent layer thickness of the ARC formed by the tool A1 or the layer thickness of the resist layer formed by the tool A2. In other embodiments, $P_{inline,i}(x,y)$ may represent data concerning the topography of the substrate to be processed, such as step height variations caused by etch and/or CMP tools arranged upstream of the photolithography tool 115.

The term $P_{inline,i}{}^{target}$ in equation (5) represents the corresponding target value of the corresponding inline parameter $P_i$. The coefficients $c_i$ represent weighting factors describing the effect of the individual inline parameters on the exposure process of the photolithography tool 115. The coefficients $c_i$ may be obtained by, for example, experiment and/or calculation in that a set of coefficients is determined that best matches the actually obtained critical dimension of a feature of interest. To this end, special test runs may be performed or the data of actual product substrates may be analyzed for a large number of substrates so as to obtain steadily stabilizing coefficients $c_i$ over time. In some embodiments, one or more of the coefficients $c_i$ may vary according to the availability of other $c_j$, coefficients. For instance, it may be advantageous to use a specified value for one or more $c_i$, for example, the layer thickness of the ARC, only as long as inline data for another inline parameter, e.g., the layer thickness of the resist layer, are not available owing to a delayed measurement or the like. Upon receipt of the missing inline parameter data or information, the coefficients $c_i$ may be reset to their actual values.

Again referring to equation (4), the position dependent offset target value $CD_{offset}(x,y)|_{residual}$ that does not relate to the inline parameters may be expressed, similarly as already explained with reference to equation (3), by the following equation:

$$CD_{offset}(x,y)|_{residual} = \alpha'(P^{el}(x,y) - P^{el}{}_{target}), \quad (6)$$

wherein $\alpha'$ is a modified constant relating the electrical parameters $P^{el}(x,y)$, $P^{el}{}_{target}$ to the offset in the exposure map. $\alpha'$ may be related to the constant a used in equation (3) by:

$$\alpha' = \alpha - (\Sigma_i \{c_i[P_{inline,i}(x,y) - P_{inline,i}{}^{target}]\})/(P^{el}(x,y) - P^{el}{}_{target}), \quad (7)$$

expressing that the influence of the electrical measurement data on the position dependent target CD value $CD_{target}(x,y)$ is proportionally reduced by the inline offset target value. In other embodiments, the constant $\alpha'$ may be obtained on the basis of further or different criteria. For instance, in a time interval of still missing electrical parameter data $P^{el}$, owing to the relative long delay compared to the availability of the inline data and information, $P_{inline,i}$, $\alpha'$ may be appropriately selected to provide for a smooth control operation of the controller 162. Upon receipt of the first electrical parameter data, $\alpha'$ may be obtained during a specified transition period by a weighted moving average to ensure a smooth controller operation even for significant deviations of the $\alpha'$ values prior to and after the receipt of the electrical parameter data.

In the illustrative embodiments described above with reference to equations (4) to (7), the controller 162 acts as a feedforward controller with respect to the inline data and/or information including a delayed feedback loop with respect to electrical parameter data. The improved availability of the inline data relative to the electrical parameter data thus allows the establishment of the position dependent CD target value $CD_{target}(x,y)$ significantly earlier, which additionally includes, contrary to the conventional approach, tool and substrate specific information. Consequently, the controller 162 is significantly more specific to the lot of substrates than is a conventional controller, thereby finally resulting in an improved uniformity of the electrical parameters.

In some embodiments, it may be considered appropriate to operate the controller 162 substantially without a feedback of the metrology system 130 when it is confirmed that the substrate non-uniformity is substantially determined by the process "neighborhood" of the photolithography tool 115 rather than by any "distant" processes and tools.

Again referring to FIGS. 1a and 1b, the control unit 161 receives the CD target value $CD_{target}(x,y)$ from the controller 162 and determines and adjusts the tool parameters of the exposure map $E(x,y)$, for example, on the basis of equation (1) or any other appropriate relationship. Thus, the exposure map $E(x_1,y_1)$, $E(x_2,y_2)$, $E(x_3,y_3)$, . . . , may be applied to form the exposure fields 151, 152, 153, . . . at the locations $\{x_1,y_1\}$, $\{x_2,y_2\}$, $\{x_3,y_3\}$, . . . and so on. In one embodiment, the control unit may be connected to the CD measurement tool 120 to compare the CD target value $CD_{target}(x,y)$ with actual measurement data of the CD of the feature under consideration. Depending on the measurement capability of the metrology tool 120, position dependent CD measurement data or averaged CD measurement data may be provided. Based on these measurement data, the control unit 161 may then readjust tool parameters, i.e., the exposure map $E(x,y)$, of the photolithography tool 115 to obtain a desired degree of match with the CD target exposure map established on the basis of the CD target value $CD_{target}(x,y)$, which is determined by the controller 162 so as to compensate for substrate internal non-uniformities. Even if the measurement tool 120 delivers position independent CD measurement data only, the corresponding global feedback may suffice to correspondingly compensate for parameter drifts of the photolithography tool 115.

In a further embodiment, the controller 162 may, alternatively to the feedforward configuration or in addition thereto, represent an inline feedback configuration as is, for example, shown by the connection to the functional block 125. The tool A3 of the previously selected process thread may represent an etch tool, possibly including a metrology instrument for determining etch specific data. The data and/or information provided by the tool A3 may also represent one or more of the above described inline parameters $P_{i,inline}$. Regarding the weighting of the corresponding coefficients $c_i$, the same criteria apply as pointed out above. The inline feedback loop established by the data and/or information stream provided by downstream blocks, such as the block 125, is also significantly more efficient compared to the conventional approach owing to the position sensitivity and the shorter availability, as is pointed out with reference to the inline feedforward loops.

In embodiments using the delayed and averaged feedback loop formed by the metrology system 130 and the controller 162, the "static part" of the CD target value $CD_{target}(x,y)$, i.e., $CD_{offset}(x,y)|_{residual}$, may still be taken into account, in addition to the dynamic update of the exposure map $E(x,y)$ by the inline feedforward and/or feedback loops. In one embodiment, the contribution of the dynamic part, i.e., the inline parameter based $CD_{offset}(x,y)|_{inline}$, may be adjusted on a long-term basis by analyzing fluctuations of the static part $CD_{offset}(x,y)|_{residual}$ that may be caused by inappropriately selected weighting factors, such as the coefficients $c_i$. In this way, a long-term self-consistency may be accomplished.

In the above-described illustrative embodiments, typically the substrates are processed on a lot basis and, thus, the inline parameter data and/or information may substantially represent averaged values of the inline parameters. One or more of the inline parameter data and/or information may, however, be readily available on a substrate basis, such as layer thickness data at least for some different positions on a substrate, or tool specific information may be immediately available as soon as a specific tool is selected for the process thread of the substrates under consideration, and enable the updating of the exposure map $E(x,y)$ on the basis of these data available at an early stage. In particular, in a feedforward configuration of the control system 160, an effective control operation may be established even for single substrates or lots including only a small number of substrates, since the inline data may be available even for the very first substrate. Therefore, the control system 160 may be configured as an effective run-to-run controller, wherein the quality of the control operation, i.e., the quality and accuracy of the exposure map, may continuously be improved as the number of available inline parameter data supplied to the controller 162 increases.

Moreover, the above control scheme may also be used to improve the quality of circuit elements not only with respect to substrate internal non-uniformities, but also with respect to substrate-to-substrate or lot-to-lot deviations.

As a result, the quality of circuit elements may be improved by using a control process in forming circuit features of critical dimension, wherein advantage is taken of the step and repeat or step and scan exposure process that allows the adaptation of exposure parameters to specified locations on the substrate. The exposure parameter may be updated in a highly dynamic fashion in that inline parameters at one or more manufacturing stages of the circuit feature, prior to and/or after the exposure process, are used to readjust the exposure parameters, thereby effectively compensating for substrate internal non-uniformities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a circuit feature on a plurality of substrates in a semiconductor production line, the method comprising:

preparing said substrates for receiving a resist mask corresponding to said circuit feature;

establishing an exposure map for a step and repeat exposure of said substrates;

updating said exposure map for a plurality of specified locations on a specified one of said substrates on the basis of:

inline measurement data obtained from one or more of said substrates, wherein at least a portion of said inline measurement data is obtained from substrates prior to exposure and from substrates after exposure; and electrical measurement data related to said circuit feature after said circuit feature is completed;

exposing said specified substrate with said updated exposure map to form said resist mask; and performing a manufacturing sequence to form said circuit feature by using said resist mask.

2. An advanced exposure tool control system, comprising: a control unit operatively connectable to an exposure tool and configured to adjust at least one exposure parameter of said exposure tool, said control unit being further configured to:

receive information about an inline parameter indicative of a characteristic of a predefined location on a plurality of substrates, said information comprising:

inline measurement data obtained from one or more of said substrates, wherein at least a portion of said inline measurement data is obtained from substrates prior to exposure and from substrates after exposure; and electrical measurement data related to a circuit feature on one of said substrates after said circuit feature is completed; and update said at least one exposure parameter for said predefined location on the basis of said information.

* * * * *